US006981380B2

(12) United States Patent
Chrysler et al.

(10) Patent No.: US 6,981,380 B2
(45) Date of Patent: Jan. 3, 2006

(54) THERMOELECTRIC COOLING FOR MICROELECTRONIC PACKAGES AND DICE

(75) Inventors: Gregory M. Chrysler, Chandler, AZ (US); Paul A. Koning, Chandler, AZ (US); Saikumar Jayaraman, Chandler, AZ (US); Makarem A. Hussein, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 10/326,864

(22) Filed: Dec. 20, 2002

(65) Prior Publication Data

US 2004/0118129 A1 Jun. 24, 2004

(51) Int. Cl.
 *F35B 21/02* (2006.01)
(52) U.S. Cl. .............................. 62/3.2; 62/3.7; 62/259.2
(58) Field of Classification Search ................ 62/3.1, 62/3.2, 3.3, 3.7, 259.2
 See application file for complete search history.

(56) References Cited

U.S. PATENT DOCUMENTS

| | | | | |
|---|---|---|---|---|
| 3,710,251 A | * | 1/1973 | Hagge et al. ............... 324/760 |
| 4,483,341 A | * | 11/1984 | Witteles ....................... 606/21 |
| 5,627,112 A | * | 5/1997 | Tennant et al. ............. 438/113 |
| 5,802,856 A | * | 9/1998 | Schaper et al. ............... 62/3.7 |
| 6,018,616 A | * | 1/2000 | Schaper ....................... 392/418 |
| 6,055,815 A | * | 5/2000 | Peterson ....................... 62/3.7 |
| 6,222,113 B1 | * | 4/2001 | Ghoshal ..................... 136/201 |
| 6,243,268 B1 | * | 6/2001 | Kang et al. ................. 361/715 |

* cited by examiner

*Primary Examiner*—Melvin Jones
(74) *Attorney, Agent, or Firm*—Schwabe, Williamson & Wyatt, P.C.

(57) ABSTRACT

Apparatus and methods in accordance with the present invention utilize thermoelectric cooling (TEC) technology to provide enhanced power distribution and/or dissipation from a microelectronic die and/or microelectronic packages. Individual TEC devices are thermally interconnected with the microelectronic die in a number of placement configurations, including between the microelectronic die and the heat sink, on the integrated heat spreader (IHS) inner surface, and on the IHS outer surface. TEC devices comprise p- and n-type semiconducting material created using similar process as the microcircuits. The TEC devices are located in various regions within or on the microelectronic die, including directly below the microcircuits, on the backside of the microelectronic die, and on a separate substrate of microelectronic die material fabricated apart from the microelectronic die and subsequently thermally coupled to the backside of the microelectronic die.

19 Claims, 6 Drawing Sheets

| ZT=1.0 | | | |
|---|---|---|---|
| | IHS Underside | IHS Topside | Heat Sink |
| θsa (C/W) | 0.15 | 0.15 | 0.17 |
| Total Power (W) (Die+TEC) | 179 | 234 | 255 |
| ZT=3.0 | | | |
| | IHS Underside | IHS Topside | Heat Sink |
| θsa (C/W) | 0.29 | 0.35 | 0.37 |
| Total Power (W) (Die+TEC) | 122 | 129 | 132 |

THERMOELECTRIC COOLING FOR MICROELECTRONIC PACKAGES AND DICE

FIELD OF THE INVENTION

The present invention relates to thermal management of microelectronic packaging and dice, and, more particularly, to solid state cooling using thermoelectric cooling devices.

BACKGROUND OF INVENTION

A microelectronic package comprises a microelectronic die electrically interconnected with a carrier substrate, and one or more other components, such as electrical interconnects, an integrated heat spreader, a heat sink, among others. An example of a microelectronic package is an integrated circuit microprocessor. A microelectronic die comprises a plurality of interconnected microcircuits within a single carrier to perform electronic circuit functions. A microelectronic device is defined as a microelectronic die with microcircuits electrically interconnected with electrically conductive pathways on the surface of or within a carrier substrate. Electrical communication between the microcircuits and external components is provided by electrically interconnected conductive pathways of the carrier substrate with electrically conductive pathways of a system substrate. An example of a system substrate is a printed circuit board (PCB), which, in some applications, is referred to as a motherboard.

Microelectronic dice generate heat as a result of the electrical activity of the microcircuits. As microelectronic dice are designed to operate at ever-increasing demands, heat generation also increases. In order to minimize the damaging effects of heat, passive and active thermal management devices are used. Such thermal management devices include heat sinks, heat spreaders, and fans, among many others. There are limitations in the use of each type of device, and in many cases, the thermal management device is specifically designed for a particular microelectronic die and package design and intended operation.

Heat sinks are one type of passive thermal management device. The principle behind a heat sink is a transfer of heat from the surface of the microelectronic die to a large thermal mass, which itself incorporates a large surface area for convective transfer the heat to the surrounding environment. Effective heat sinks tend to be very large and have sophisticated design with regards to fins and or pin heat releasing surfaces.

Integrated heat spreaders (IHS) are passive thermal conducting lids or caps placed in intimate thermal contact with the backside or inactiveside of the microelectronic die. Integrated heat spreaders also have sides that extend to seal against the carrier substrate, containing and protecting the microelectronic die and the electrical interconnects from the environment. Integrated heat spreaders also spread the thermal energy from localized areas on the microelectronic die surface to other areas of the die surface not only to mitigate local hot spots, but in some cases the microcircuits operate more efficiently if the die is a uniform temperature. The integrated heat spreader also provides an enlarged flat surface into which a heat sink may be attached.

Non-uniform power distribution within the microelectronic die results in local areas of high heat flux (hot spots) that must be mitigated. The root cause of the localized high heat flux is a result of the circuit layout having a highly non-uniform power distribution across the die.

The thermal management device must be able to maintain these hot spots at or below a specified temperature. This is very difficult when the local heat can be 10-times the microelectronic die average. Current devices are overwhelmed and limited in their ability to mitigate these local high heat flux sources. The thermal resistance between the heat sink and/or heat spreader is not low enough to adequately provide the necessary thermal mitigation in a reasonably sized system. Current devices cannot address the fundamental problem of power non-uniformity within the microelectronic die.

Apparatus and methods are needed to mitigate the effects of non-uniform power distribution and for providing the required heat flux distribution across the microelectronic die. They must provide for exceptionally small-scale integration, not interfere with the electrical interface of other components within the microelectronic package, and inexpensive to manufacture.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Thermoelectric cooling (TEC) devices operate under the principle known as the Peltier Effect. The Peltier Effect provides that electrons flowing through a series interconnection between an electron deficient p- type semiconductor material and an electron rich n-type semiconductor material will either absorb energy, cooling the interconnection, or emit energy, heating the interconnection, depending on the direction of electron flow. The interconnection can be thermally coupled to a structure to heat or cool the structure.

Electrons driven out of the n-type material and into the p-type material will emit energy to the environment at the interconnection, becoming the hot side of the TEC. Electrons driven out of a p-type material and into an n-type material will absorb energy from the environment at the interconnection, causing the interconnection to decrease in temperature, becoming the cold side of the TEC device. Reversing the electron flow will cause the cold side to become the hot side and the hot side to become the cold side. Therefore the operating characteristics of the TEC device can be controlled by regulating the polarity of a voltage source driving the current.

Figure 1:
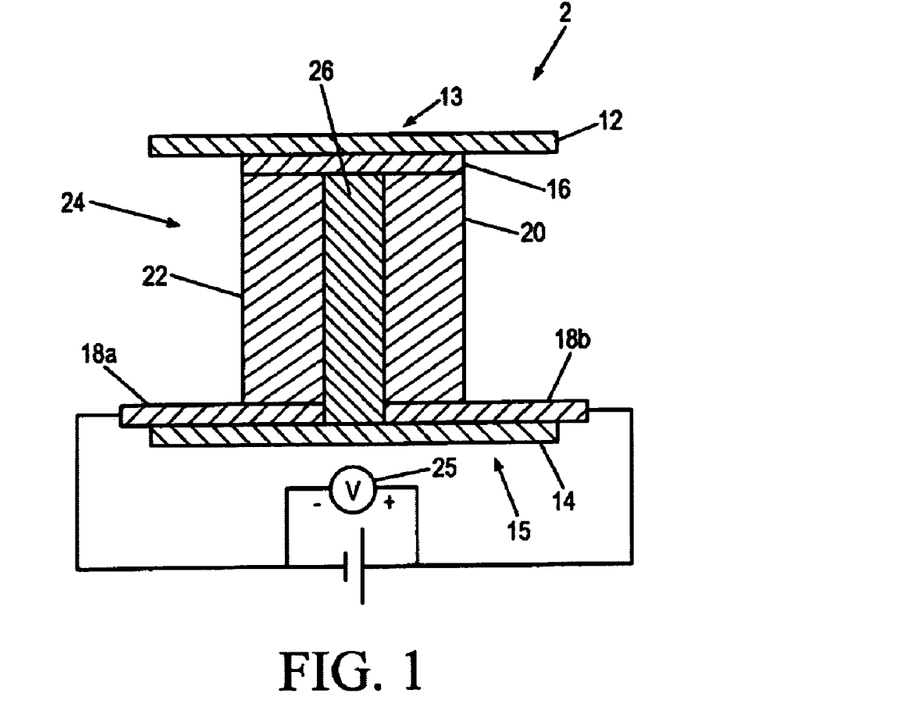
FIG. 1 is a cross-sectional view of an embodiment of a TEC device in accordance with the present invention.

Apparatus and methods in accordance with the present invention utilize TEC technology to provide enhanced power dissipation from a microelectronic die and/or reduced operating temperature. FIG. 1 is a cross-sectional view of an embodiment of a TEC device 2 in accordance with the present invention. The TEC device 2 comprises a first TEC substrate 12, a second TEC substrate 14, and a couple 24 comprising a p-element 20, an n-element 22, a thermal and electrical insulator 26 disposed between the p- and n-elements 20, 22, first TEC interconnect 16 adjacent the first TEC substrate 12 is electrically interconnected with the p-element 20 and the n-element 22, and two second TEC interconnects 18 opposite the first TEC interconnect 16, each second TEC interconnect 18 adjacent the second TEC substrate 14 and interconnected with one of the corresponding p- and n-material 20, 22, respectively.

A positive DC voltage applied to the second TEC interconnect 18 interconnected with the p-element 20 causes electrons to flow from the n-element 22 to the p-element 20, the electrons emitting energy and thus heating the first TEC interconnect 16 and the first TEC substrate 12 thermally coupled thereto, referred to as the hot side 13. Electrons are also driven into the n-element at the second TEC interconnect 18a and out of the p-element at the second TEC interconnect 18b, the electrons absorbing energy and thus cooling the second interconnection 18a,b and the second TEC substrate 14 thermally coupled thereto, referred to as the cold side 15.

Figure 2:
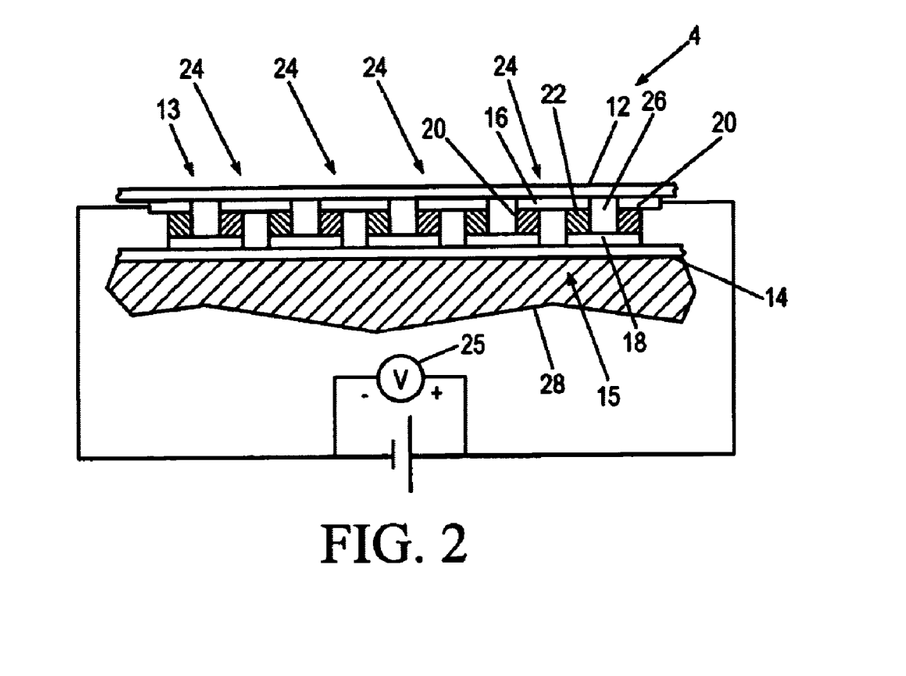
FIG. 2 is a cross-sectional view of an embodiment of a TEC device in accordance with the present invention.

FIG. 2 is a cross-sectional view of an embodiment of a TEC device 4 in accordance with the present invention. A plurality of TEC couples 24 of FIG. 1, are electrically interconnected in series and thermally interconnected in parallel to provide greater thermal transfer performance.

In accordance with embodiments of the present invention, the TEC device is used in conjunction with a thermal dissipation device, such as, but not limited to, an IHS or a heat sink. The choice of placing the TEC devices on the IHS or heat sink will result in different optimization solution, requiring different power input, different cold side substrate temperature, and different TEC device temperature rise. Placement of the TEC device on the IHS or heat sink is dependent on the chosen optimization scheme, including: minimizing power, maximizing temperature difference, or maximizing cold side temperature.

Figure 3A:
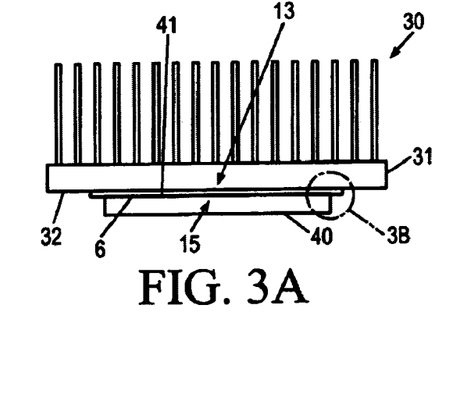
FIGS. 3A and 3B are cross-sectional views of a TEC device coupled to a heat sink base in accordance with an embodiment of present invention.
Figure 3B:
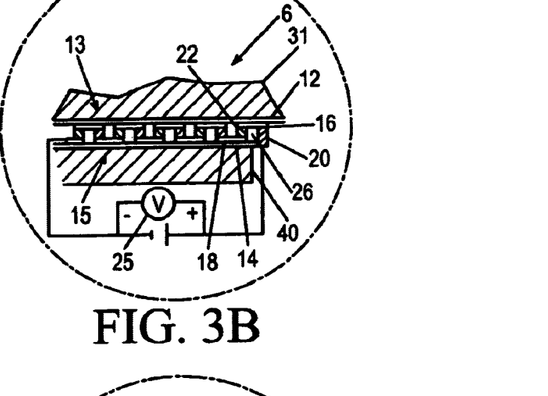

Three TEC device embodiments in accordance with the present invention are discussed below, but are not limited to those three configurations or electrical components therein. FIGS. 3A and 3B are side and cross-sectional views, respectively, of a TEC device 6 coupled to a bottom surface 32 of a heat sink base 31 in accordance with an embodiment of present invention. The TEC device 6 comprises alternating p-elements 20 and n-elements 22 between a first TEC substrate 12 and a second TEC substrate 14, wherein the first TEC substrate 12 is thermally coupled to the bottom surface 32 of the heat sink base 31. Second TEC substrate 14 is thermally coupled to a heat source 40, such as, but not limited to, the back side 41 of a microelectronic die, or to another component, such as an IHS. Thermal energy from the heat source will be conducted to the cold side 15 of the TEC device 6 when the TEC device 6 is supplied with a positive voltage. The TEC device 6 will pump the thermal energy of the heat source to the hot side 13 and into the base 31 of the heat sink 30, to be dissipated through convection into the environment.

Figure 4A:
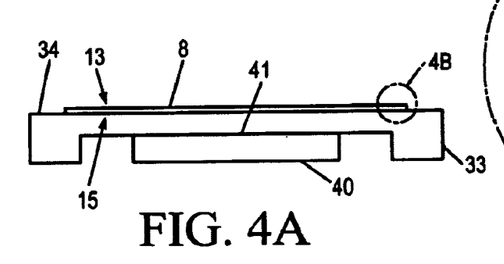
FIGS. 4A and 4B are cross-sectional views of a TEC device in accordance with another embodiment of present invention.
Figure 4B:
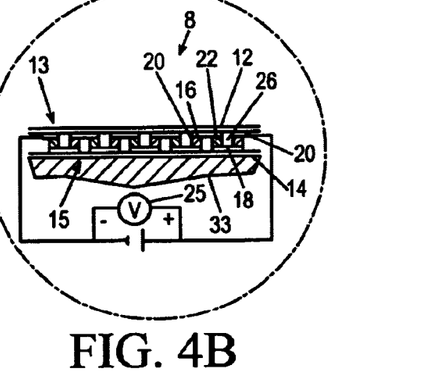

FIGS. 4A and 4B are side and cross-sectional views, respectively, of a TEC device 8 in accordance with another embodiment of present invention. The TEC device 8 comprises alternating p-elements 20 and n-elements 22 between a first TEC substrate 12 and a second TEC substrate 14, wherein the second TEC substrate 14 is thermally coupled to the outer surface 34 of an IHS 33. Thermal energy from the heat source 40, such as, but not limited to, a microelectronic die, will be conducted through the IHS 33, which will to some degree, diffuse non-uniform high heat flux to the cold side 15 of the TEC device 8. The TEC device 8, when supplied with a positive voltage to the p-element, will pump the thermal energy to the hot side 13 and into a secondary structure, such as, but not limited to, an attached heat sink (not shown), or to the environment in contact with the hot side 13.

Figure 5A:
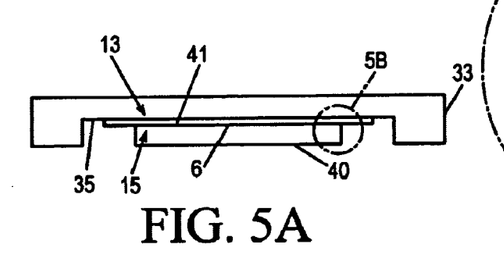
FIGS. 5A and 5B are cross-sectional views of a TEC device in accordance with another embodiment of present invention.
Figure 5B:
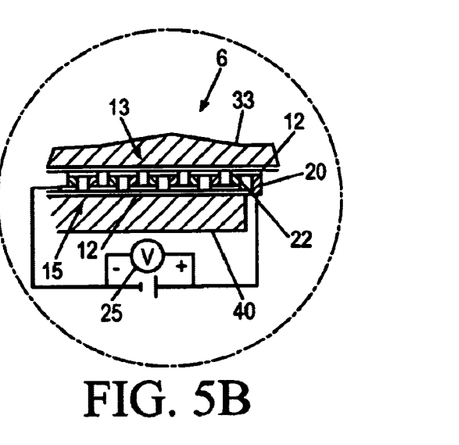

FIGS. 5A and 5B are side and cross-sectional views, respectively, of a TEC device 6 in accordance with another embodiment of present invention. The TEC device 6 is substantially the same as the TEC device 6 of FIG. 3B. The hot side 13 is thermally coupled to the inside surface 35 of a IHS 33 and the cold side 15 is thermally coupled with the heat source 40, such as, but not limited to, the microelectronic die. Thermal energy from the heat source 40 will be conducted to the cold side 15, and the TEC device 6 will pump the thermal energy to the hot side 13 and into the IHS 33.

The p-elements 22 and the n-elements 20 can be deposited onto the respective substrate using deposition, layering, plating, screening, sputtering, and soldering techniques known to those in the semiconductor art.

Current off the shelf TEC technology has a figure of merit (ZT) of about 1. Super lattice materials can push that to 3 or higher. Higher ZT values are needed for thermoelectric cooling of microelectronic die to reduce the requirement for extra power dissipation, that is, the power input to the TEC device. Regardless of the ZT value there are certain characteristics of TEC that remain constant. These characteristics include: higher input power is required to handle the pumping of a higher heat flux; higher input power is required to provide a higher temperature difference between the cold side and the hot side; and higher input power is required to provide a lower cold side temperatures (Tc).

The TEC device requires input power in the form of a DC voltage. Although the scale of the p- and n-elements is extremely small, on the order of, but not limited to, 5 to 50 $\mu$m, for example, the power leads can be conventional in nature. In one embodiment in accordance with the present invention, a two-wire power harness is connected after the heat sink is attached to a microelectronic package component. A similar method could be used for a TEC device on the outside surface of the IHS. Attachment of the power leads to a TEC device on the inside surface of the IHS is more difficult requiring penetrations.

Figure 6:
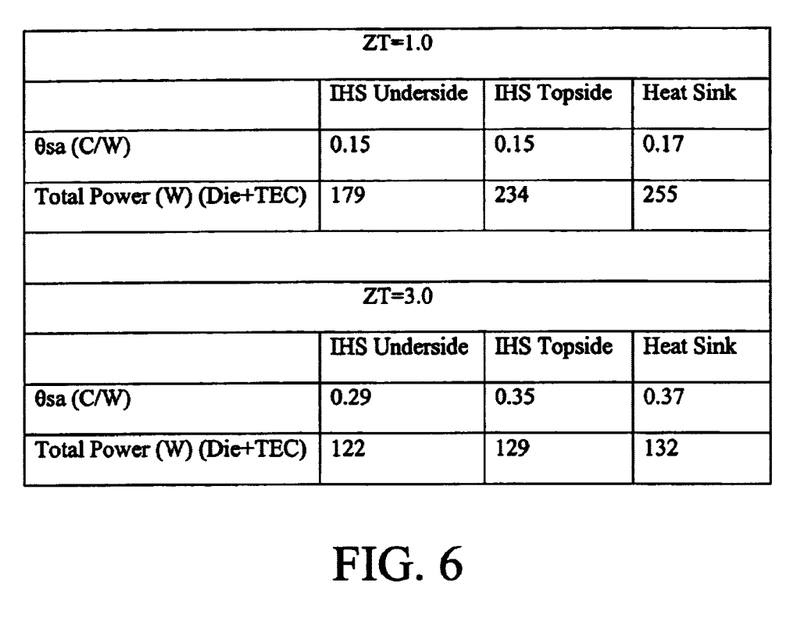
FIG. 6 is a table comprising the requirements for the heat sink for each case.

Validation analysis was completed for each of the three placement embodiments based on one set of physical conditions. A microprocessor in a standard IHS package was set to produce a 60 W heat flux. For each case, the TEC device hot side was held at 100 C, the microelectronic die temperature was fixed at 65 C, and the air temperature held at 45 C. FIG. 6 is a table comprising the requirements for the heat sink for each case.

An experimental control was used where no TEC device was used with the same IHS package, and holding the die to 65 C. The required heat sink resistance was 0.17 C/W. The total power dissipation by the heat sink, and drawn from the power supply, was 60 W.

Placement of the TEC device 6 on the base of the heat sink will require the TEC device 6 to maintain the lowest cold side temperature, the lowest cold side to hot side temperature difference, and be required to operate with the lowest heat flux.

Placement of the TEC device 8 on the outer surface of the IHS will require the TEC device 8 to maintain a lower cold side temperature, a smaller cold side to hot side temperature difference, and since the power dissipation from the microelectronic die has spread while diffusing through the IHS, it will be required to operate with a smaller heat flux.

Placement of the TEC 6 device on the inside surface of the IHS will require the TEC device 6 to maintain the highest cold side temperature, but also the greatest cold side to hot side temperature difference, and require it to handle the highest heat flux due to its proximity to the microelectronic die.

In accordance with other embodiments of the present invention, TEC devices are located on or within the microelectronic die itself to reduce areas of localized heat flux (hot spots). Having the TEC devices within the substrate of the microelectronic die helps to reduce the peak temperature on the die, reduce the temperature gradient across the die, and allows for the TEC device to be incorporated into the circuit design for specific applications.

Semiconductor substrate, such as silicon wafer, for example, can be provided with p- and n-type material through the well known processes of the semiconductor art. In these embodiments, the capability to create p- and n-type features on the substrate and to electrically connect them in a series circuit, is used to create the p- and n-elements of one or more TEC devices. The arrangement of the p- and n-elements and the corresponding voltage will determine the direction of heat transport along the TEC devices.

Figure 7:
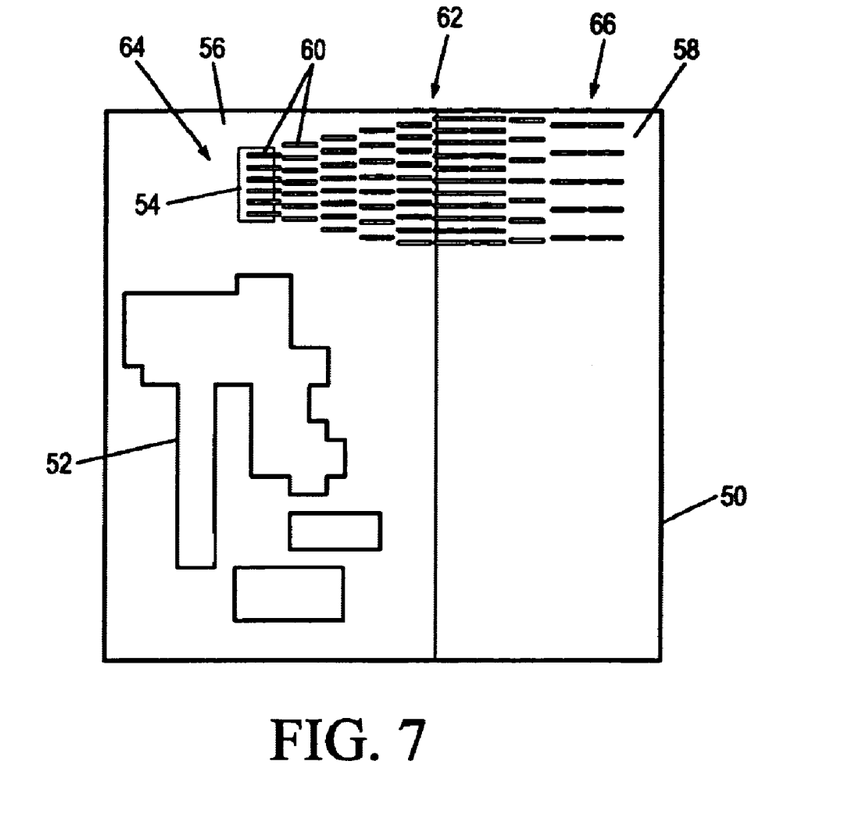
FIG. 7 is an embodiment of a semiconductor substrate comprising a TEC array of TEC devices in accordance with the present invention.

FIG. 7 is an embodiment of a semiconductor substrate 50 comprising a TEC array 62 of TEC devices 60 in accordance with the present invention. The TEC devices 60 are created onto the microelectronic die 50 in an array, or pattern, so as to draw the thermal power from the high heat flux areas(s) 64 and deposit it to the low heat flux area 66. Examples of high and low heat flux areas 64, 66, include, but are not limited to, computation circuit 54 and cache memory circuit locations 58, respectively. The TEC devices 60 are patterned with respect to the circuit design to result in a more uniformly powered die 50.

Each TEC device 60 includes either a single coupled pair, a p- and an n-element, or multiple couples. The TEC array 62 as shown comprises multiple steps or stages of TEC devices 60 that fan out from the high heat flux area 64, a high power density region, and become less dense as needed to move and distribute the thermal energy to the relatively low heat flux area 66a, low power density region.

Figure 8:
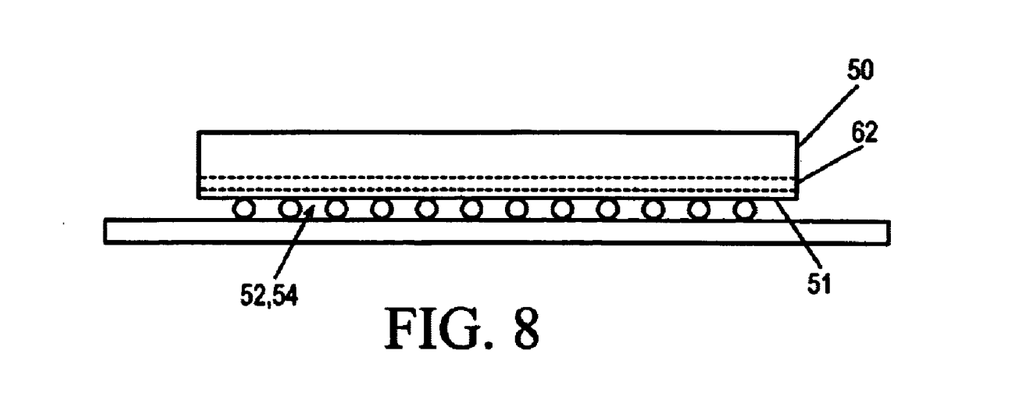
FIG. 8 is a side view of an embodiment wherein TEC devices are located on the active side of the microelectronic die in accordance with the present invention.

The TEC array 62 of TEC devices 60 can be located in various places within or on the microelectronic die 50, in accordance with embodiment of the present invention. FIG. 8 is a side view of an embodiments in accordance with the present invention wherein the deposition of the TEC devices 60 onto the substrate of the microelectronic die 50 is made prior to creation of the microcircuits 52, 54 on the active side 51 of the microelectronic die 50. The TEC devices 60 are therefore directly below the microcircuits 54 on the active side 51. This embodiment provides a strong coupling between the TEC array 62 and the microcircuits 54 that are to be cooled. In another embodiment, the TEC elements 60 are created after the microcircuits 52, 54, wherein the TEC devices 60 are directly above the microcircuits 52, 54.

Figure 9:
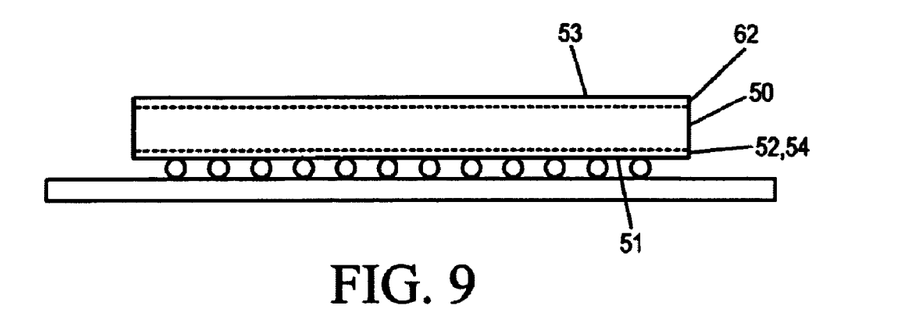
FIG. 9 is a side view of an embodiment of TEC devices on the backside of the microelectronic die in accordance with the present invention.

FIG. 9 is a side view of an embodiment in accordance with the present invention wherein the deposition of TEC devices 60 is onto the backside 53 of the microelectronic die 50. The placement in this location is less invasive to the circuitry than on the active side 51. In the embodiments of FIGS. 8 and 9, the manufacturing of the microelectronic die 50 involves the additional steps of applying 3 or more fabrication layers onto the microelectronic die 50 to create the TEC devices 60.

Figure 10:
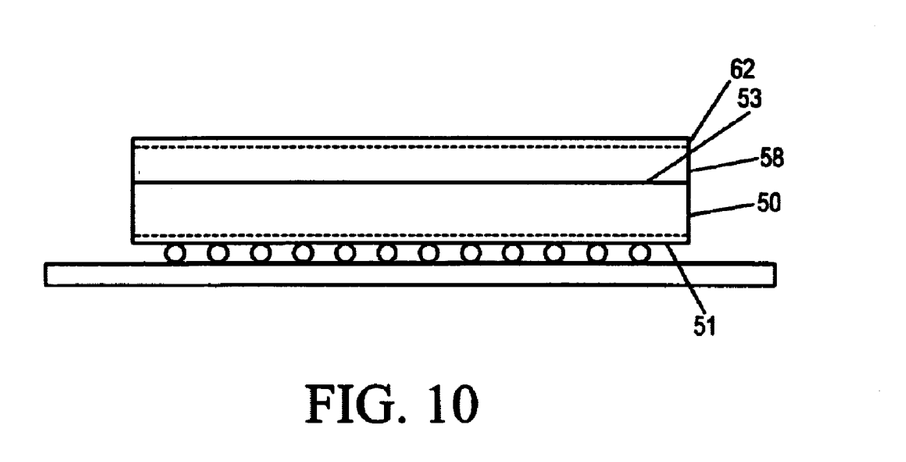
FIG. 10 is a side view of an embodiment of TEC devices is on a separate TEC substrate in accordance with the present invention.

FIG. 10 is a side view of an embodiment in accordance with the present invention wherein the deposition of the TEC array 62 is on a separate TEC substrate 58. The TEC substrate 58 comprises the same material as the microelectronic die 50. In other embodiments in accordance with the present invention, the TEC substrate 58 is not the same material as the microelectronic die 50. The TEC substrate 58 is then thermally coupled, or bonded, to the backside 53 of the microelectronic die 50. This embodiment provides the ability to couple the TEC substrate 58 to the microelectronic die 50 after both have passed some functional tests to ensure they are operational units. This embodiment also provides the ability to process the TEC substrate 58 and the microelectronic die 50 in device-specific processes without compromising the quality of the other.

With a separate TEC substrate 58 and microelectronic die 50, the ability to thin one or both for improved thermal performance is provided. In an example wherein the TEC substrate 58 and microelectronic die 50 comprise silicon (Si), methods for Si to Si bonding with void-free bonds and bond strengths approaching a monolithic piece of Si are known in the art. Silicon to silicon bonding is practiced commercially with several companies supplying bonding equipment. One process involves cleaning the two silicon surfaces with $H_2SO_4+H_2O_2$ or $NH_4OH+H_2O_2+H_2O$, optionally applying a surface activation agent, TEOS or NaSi, and pressing together and heating to a moderate temperature of about 200–400 C. There are also known methods for bonding $Si_4N_3$ coated substrate and bonding substrate with Au—Si solder. Regardless of the process, the result should be a hybrid substrate consisting of a microelectronic die with a stacked TEC substrate, but without a measurable bond resistance between the two.

The three embodiments above employ microelectronic circuit fabrication techniques to fabricate small, micron scale TEC devices 60. TEC devices 60 in this size scale can transfer greater energy per unit area than larger TEC devices.

The TEC devices 60 are operated with a voltage source interconnected thereto. The power input is a function of the temperature difference between the hot and cold sides 13, 15. One principle for using the above embodiments is to make the microelectronic die 50 appear, to the thermal management system, such as a heat sink, more uniformly powered and thus more uniform in temperature. The resultant uniform temperate field provides that the temperature difference between the hot and cold sides 13, 15 of the TEC devices 60 will be very small. Therefore the power draw of the TEC devices 60 will be minimal, and the efficiency will be reasonably high.

Figure 11:
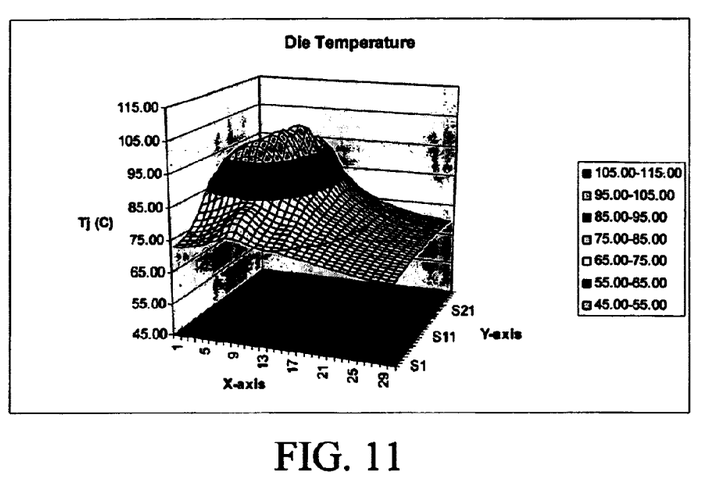
FIGS. 11 and 12 are temperature maps for the non-TEC device cooled simulated microelectronic die and the TEC cooled die, respectively, in accordance with embodiments of the methods of the present invention.
Figure 12:
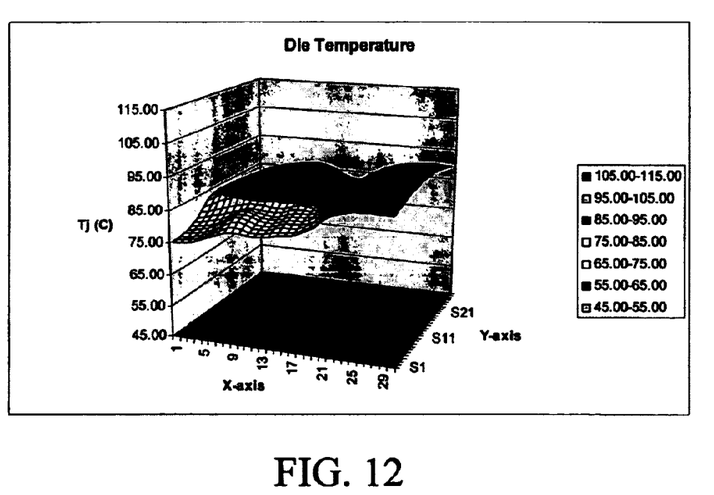

FIGS. 11 and 12 are temperature maps of a simulated microelectronic die without and with a TEC devices, respectively, in accordance with embodiments of the methods of the present invention. The non-uniform power state for the microelectronic die of FIG. 11 has a total power dissipation of 82.5 W and a peak local flux that is 9.7× the average flux. For the TEC device-equipped die, the power moved across the die is 30.7 W and the additional power input, and therefore cooling by the TEC devices, is 15.3 W. Although the TEC device-equipped die dissipates 15.3 W (19%) more than the non-TEC device-equipped die, because of the more uniform temperature field, the peak temperature is reduced by 10.7 C.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method, comprising:
   thermally coupling a second TEC substrate of two or more thermoelectric cooling devices with a microelectronic die;
   electrically connecting the two or more thermoelectric cooling devices in series; and
   thermally coupling a first TEC substrate of the two or more thermoelectric cooling devices with an inner surface of an integrated heat spreader.

2. A method, comprising:
   thermally coupling a second TEC substrate of two or more thermoelectric cooling devices with a microelectronic die;
   electrically connecting the two or more thermoelectric cooling devices in series; and
   wherein thermally coupling comprises thermally coupling the second TEC substrate of two or more thermoelectric cooling devices with an outer surface of an integrated heat spreader and thermally coupling the microelectronic die with the inside surface of the integrated heat spreader.

3. A method, comprising:
   thermally coupling a second TEC substrate of two or more thermoelectric cooling devices with a microelectronic die;
   electrically connecting the two or more thermoelectric cooling devices in series; and
   wherein each of the two or more thermoelectric cooling devices comprising one or more couples, each couple having a p-element of p-semiconducting material and an n-element of n-semiconducting material, the p- and n- elements electrically interconnected at the first TEC substrate and the p- and n- elements electrically insulated at the second TEC substrate, the p-element of one couple electrically interconnected with either a positive voltage lead or an n-element of an adjacent couple, and the n-element of the one couple electrically interconnected with either a negative voltage lead or a p-element of another adjacent couple.

4. A microelectronic package, comprising:
   a microelectronic die;
   a carrier substrate coupled to the microelectronic die; and
   one or more thermoelectric cooling devices, the one or more thermoelectric cooling devices having a first TEC substrate and a second TEC substrate, the microelectronic die thermally coupled with the second TEC substrate of the one or more thermoelectric cooling devices.

5. The microelectronic package of claim 4, further comprising:
   a heat sink thermally coupled with the first TEC substrate of the one or more thermoelectric cooling devices.

6. The microelectronic package of claim 4, further comprising:
   an integrated heat spreader having an inner side and an outer side, the inner side thermally coupled with the first TEC substrate of each of the one or more thermoelectric cooling devices.

7. The microelectronic package of claim 4, further comprising:
   an integrated heat spreader disposed between and thermally coupled with the microelectronic die and the second TEC substrate of each of the one or more thermoelectric cooling devices.

8. The microelectronic package of claim 4, wherein the one or more thermoelectric cooling devices further comprising one or more couples, each couple having a p- element and an n- element, the p- and n- elements electrically interconnected at the first TEC substrate and the p- and n- elements electrically insulated at the second TEC substrate, the p- element of one couple electrically interconnected with either the positive voltage lead or an n- electrode of an adjacent couple, and the n- element of the one couple electrically interconnected with either the negative voltage lead or a p- element of another adjacent couple.

9. A method, comprising:
   creating an array of a plurality of thermoelectric cooling devices onto a microelectronic die; and
   electrically connecting two or more of the plurality of thermoelectric cooling devices in series.

10. The method of claim 9, wherein creating an array of a plurality of thermoelectric cooling devices onto a microelectronic die comprises:
    creating the array of the plurality of thermoelectric cooling devices onto an active side of the microelectronic die prior to creating microcircuits onto the active side of the microelectronic die.

11. The method of claim 9, wherein creating an array of a plurality of thermoelectric cooling devices onto a microelectronic die comprises:
    creating the array of the plurality of thermoelectric cooling devices onto a back side of the microelectronic die.

12. The method of claim 9, wherein creating an array of a plurality of thermoelectric cooling devices onto a microelectronic die comprises:
    creating the array of the plurality of thermoelectric cooling devices onto a substrate, the substrate thermally coupled to a back side of the microelectronic die.

13. The method of claim 9, wherein the microelectronic die has a substrate and wherein creating an array of a plurality of thermoelectric cooling devices onto a microelectronic die comprises:

creating the array of the plurality of thermoelectric cooling devices onto the substrate and coupling the substrate to a back side of the microelectronic die.

14. The method of claim 9, wherein each of the plurality of thermoelectric cooling devices created comprising one or more couples, each couple having a p- element and an n- element, the p- and n- elements electrically interconnected in series, the p- element of one couple electrically interconnected with either a positive voltage lead or an n- element of an adjacent couple, and the n- element of the one couple electrically interconnected with either a negative voltage lead or a p- element of another adjacent couple.

15. A microelectronic die, comprising:
a microelectronic die substrate;
a thermoelectric cooling device array layer having a plurality of thermoelectric cooling devices; and
an active microcircuit layer having a plurality of microcircuits.

16. The microelectronic die of claim 15, wherein the thermoelectric cooling device array layer is disposed between the microelectronic die substrate and the active microcircuit layer.

17. The microelectronic die of claim 15, wherein the microelectronic die substrate is disposed between the thermoelectric cooling device array layer and the active microcircuit layer.

18. The microelectronic die of claim 15, wherein the thermoelectric cooling device array layer is thermally bonded to a first side of the microelectronic die substrate and the active microcircuit layer located on a second side of the microelectronic die substrate opposite of the first side.

19. The microelectronic die of claim 15, wherein the plurality of thermoelectric cooling devices comprise one or more couples, each couple having a p- element of p- semiconducting material and an n- element of n- semiconducting material, the p- and n- elements electrically interconnected at a first end and electrically insulated at a second end, the p- element of one couple electrically interconnected with either the positive voltage lead or an n- element of an adjacent couple, and the n- element of the one couple electrically interconnected with either the negative voltage lead or a p- element of another adjacent couple.

* * * * *

UNITED STATES PATENT AND TRADEMARK OFFICE
CERTIFICATE OF CORRECTION

PATENT NO. : 6,981,380 B2
APPLICATION NO. : 10/326864
DATED : January 3, 2006
INVENTOR(S) : Chrysler et al.

It is certified that error appears in the above-identified patent and that said Letters Patent is hereby corrected as shown below:

Column 3
Line 37, "…p- and n-material 20, 22,…" should read --…p- and n-elements 20, 22,…--.

Column 4
Line 46, "…p-elements 22…" should read --…p-elements 20…--.
Line 46, "…n-elements 20…" should read -- …n-elements 22…--.

Column 5
Line 53, "…semiconductor substrate 50…" should read --…microelectronic die 50…--.

Column 6
Line 3, "…flux area 66a, …" should read --…flux area 66, …--.
Line 15, "…TEC elements 60…" should read --…TEC devices 60…--.

Signed and Sealed this

Twentieth Day of March, 2007

JON W. DUDAS
*Director of the United States Patent and Trademark Office*